(12) United States Patent
Chwala et al.

(10) Patent No.: US 7,977,940 B2
(45) Date of Patent: Jul. 12, 2011

(54) LOW TEMPERATURE SQUID TRANSIENT ELECTROMAGNETIC RECEIVER SYSTEM

(76) Inventors: Andreas Chwala, Jena (DE); James McNae, Melbourne (AU); Ronny Stolz, Jena (DE)

( * ) Notice: Subject to any disclaimer, the term of this patent is extended or adjusted under 35 U.S.C. 154(b) by 636 days.

(21) Appl. No.: 11/886,217

(22) PCT Filed: Mar. 9, 2006

(86) PCT No.: PCT/IB2006/000509
§ 371 (c)(1),
(2), (4) Date: Aug. 14, 2008

(87) PCT Pub. No.: WO2006/095251
PCT Pub. Date: Sep. 14, 2006

(65) Prior Publication Data
US 2009/0160444 A1 Jun. 25, 2009

(30) Foreign Application Priority Data
Mar. 9, 2005 (ZA) .................................. 2005/01992

(51) Int. Cl.
*G01R 33/02* (2006.01)
*G01V 3/06* (2006.01)
(52) U.S. Cl. .................. 324/248; 324/262; 324/326
(58) Field of Classification Search .................. 324/248, 324/262, 326
See application file for complete search history.

(56) References Cited

U.S. PATENT DOCUMENTS

| 4,165,480 | A | 8/1979 | Morrison |
| 4,860,756 | A | 8/1989 | Ko et al. |
| 5,845,500 | A | 12/1998 | Podney |
| 5,896,031 | A | 4/1999 | King |
| 6,541,966 | B1 | 4/2003 | Keene |
| 2002/0030492 | A1 | 3/2002 | Guo et al. |
| 2003/0025503 | A1 | 2/2003 | Fanini et al. |
| 2003/0076107 | A1 | 4/2003 | Fanini et al. |
| 2003/0080868 | A1 | 5/2003 | Nelson |
| 2004/0196045 | A1 | 10/2004 | Larsen |
| 2004/0239329 | A1 | 12/2004 | Haber et al. |

FOREIGN PATENT DOCUMENTS
GB 899607 6/1962

*Primary Examiner* — Reena Aurora
(74) *Attorney, Agent, or Firm* — Nelson Mullins Riley & Scarborough LLP; Anthony A. Laurentano

(57) ABSTRACT

A receiver system (18) for an electromagnetic prospecting system is disclosed. The electromagnetic prospecting system comprises a transmitter for transmitting a primary electromagnetic field so as to generate a secondary electromagnetic field from a terrain that is being prospected, the secondary electromagnetic field having a transient, decaying time domain profile. The receiver system (18) comprises first and second sensors (20, 22) for detecting the secondary electromagnetic field, wherein the second sensor (22) is less sensitive than the first sensor (20) so as to detect the secondary electromagnetic field over a first time period, with the first sensor (20) being used to detect the secondary electromagnetic field after the first time period. Typically, each sensor (20, 22) comprises three orthogonal SQUID magnetometers, with the second sensor (22) being approximately 10 times less sensitive than the first sensor (20).

15 Claims, 1 Drawing Sheet

LOW TEMPERATURE SQUID TRANSIENT ELECTROMAGNETIC RECEIVER SYSTEM

RELATED APPLICATIONS

This application is a 35 U.S.C. 371 national stage filing of International Application No. PCT/IB2006/000509, filed 9 Mar. 2006, which claims priority to South Africa Patent Application No. 2005/01992 filed on 9 Mar. 2005 in South Africa. The contents of the aforementioned applications are hereby incorporated by reference.

BACKGROUND OF THE INVENTION

THIS invention relates to a transient electromagnetic receiver system, and to a method of collecting data in an electromagnetic prospecting system.

Typical prospecting systems comprise a transmitter for transmitting a primary electromagnetic field into the ground. A receiver, comprising either a one-component or a three-component receiving coil and associated electronics, is provided for receiving and recording a resulting, secondary electromagnetic field produced by eddy currents emanating from the interaction between underground ore bodies and the primary electromagnetic field. Generally, insignificant eddy-current induced secondary electromagnetic fields are received in areas where the ground has an average to low electrical conductivity, whereas in more conductive areas stronger eddy currents tend to be generated, thereby causing an appreciable secondary electromagnetic field to be created.

The secondary electromagnetic field is a transient field having a decaying profile 10 of the type shown in FIG. 1, wherein the y-axis is the secondary field amplitude, on a log scale, and the x-axis is time, on a log scale. Typically, the receiving coil of the receiver comprises three orthogonal sensors, which detects the secondary field in the range indicated by arrow 12. It is clear from arrow 12 that the highest detection level of the receiver is set to just above the maximum value of profile 10, with the lowest level of the receiver defining a threshold 14, due to the physical limitations of the receiver. It is thus clear from FIG. 1 that the secondary field after time $t_1$, corresponding to broken line component 16 of the response, would not be detected.

It would, however, be desirable and useful to detect the secondary electromagnetic field after time $t_1$ in addition to the field response before time $t_1$. This may, for example, indicate the presence of conductive ore bodies located relatively deeper underground. The present invention is aimed at addressing this shortcoming of existing electromagnetic prospecting systems and methods.

SUMMARY OF THE INVENTION

According to a first aspect of the invention there is provided an electromagnetic prospecting system comprising:
 a transmitter for transmitting a primary electromagnetic field so as to generate a secondary electromagnetic field from a terrain that is being prospected, the secondary electromagnetic field having a transient, decaying time domain profile; and
 a receiver system comprising first and second sensors for detecting the secondary electromagnetic field, wherein the second sensor is less sensitive than the first sensor so as to detect the secondary electromagnetic field over a first time period, with the first sensor being used to detect the secondary electromagnetic field after the first time period.

Conveniently, the electromagnetic prospecting system further includes a data collector that is connected to the first and second sensors, for collecting and recording field data over the entire decay curve of the secondary electromagnetic field.

Preferably, the data collector collects and records field data over the entire decay curve of the secondary electromagnetic field to a lower sensitivity level of 5 fT/√Hz for subsequent processing.

In an example embodiment, the second sensor is approximately 10 times less sensitive than the first sensor.

Typically, each sensor comprises three orthogonal magnetometers.

Conveniently, the magnetometers of the first and second sensors are low temperature superconducting quantum interference device (SQUID) magnetometers.

According to a second aspect of the invention there is provided a receiver system for an electromagnetic prospecting system comprising a transmitter for transmitting a primary electromagnetic field so as to generate a secondary electromagnetic field from a terrain that is being prospected, the secondary electromagnetic field having a transient, decaying time domain profile, the receiver system comprising first and second sensors for detecting the secondary electromagnetic field, wherein the second sensor is less sensitive than the first sensor so as to detect the secondary electromagnetic field over a first time period, with the first sensor being used to detect the secondary electromagnetic field after the first time period.

Conveniently, the receiver system further includes a data collector that is connected to the first and second sensors, for collecting and recording field data over the entire decay curve of the secondary electromagnetic field.

Preferably, the data collector collects and records field data over the entire decay curve of the secondary electromagnetic field to a lower sensitivity level of 5 fT/√Hz for subsequent processing.

In an example embodiment, the second sensor is approximately 10 times less sensitive than the first sensor.

Typically, each sensor comprises three orthogonal magnetometers.

Conveniently, the magnetometers of the first and second sensors are low temperature superconducting quantum interference device (SQUID) magnetometers.

According to a third aspect of the invention there is provided a method of collecting data in an electromagnetic prospecting system comprising a transmitter for transmitting a primary electromagnetic field so as to generate a secondary electromagnetic field from a terrain that is being prospected, the secondary electromagnetic field having a transient, decaying time domain profile, the method comprising the steps of:
 providing a receiver system comprising first and second sensors for detecting the secondary electromagnetic field, wherein the second sensor is less sensitive than the first sensor
 using the second sensor to detect the secondary electromagnetic field over a first time period; and
 using the first sensor to detect the secondary electromagnetic field after the first time period.

Typically, the method further includes collecting and recording field data detected by the first and second sensors over the entire decay curve of the secondary electromagnetic field.

Preferably, the method includes collecting and recording field data over the entire decay curve of the secondary electromagnetic field to a lower sensitivity level of 5 fT/√Hz for subsequent processing.

DESCRIPTION OF THE PREFERRED EMBODIMENT

Referring to the figures, a receiver system 18 for use in an electromagnetic system according to the present invention comprises a first, relatively sensitive, sensor 20, and a second sensor 22 that is less sensitive than the first sensor 20. Typically, the second sensor 22 is 10 times less sensitive than the first sensor 20, so as to provide a larger dynamic and slew rate than the first sensor. Thus, the first sensor 20 is used to detect the secondary electromagnetic field after time $t_1$, whereas the second sensor 14 is used to detect the field before time $t_1$.

Each sensor 20, 22 comprises three orthogonal magnetometers 24A, 24B and 24C, and 26A, 26B and 26C, respectively.

Figure 1:
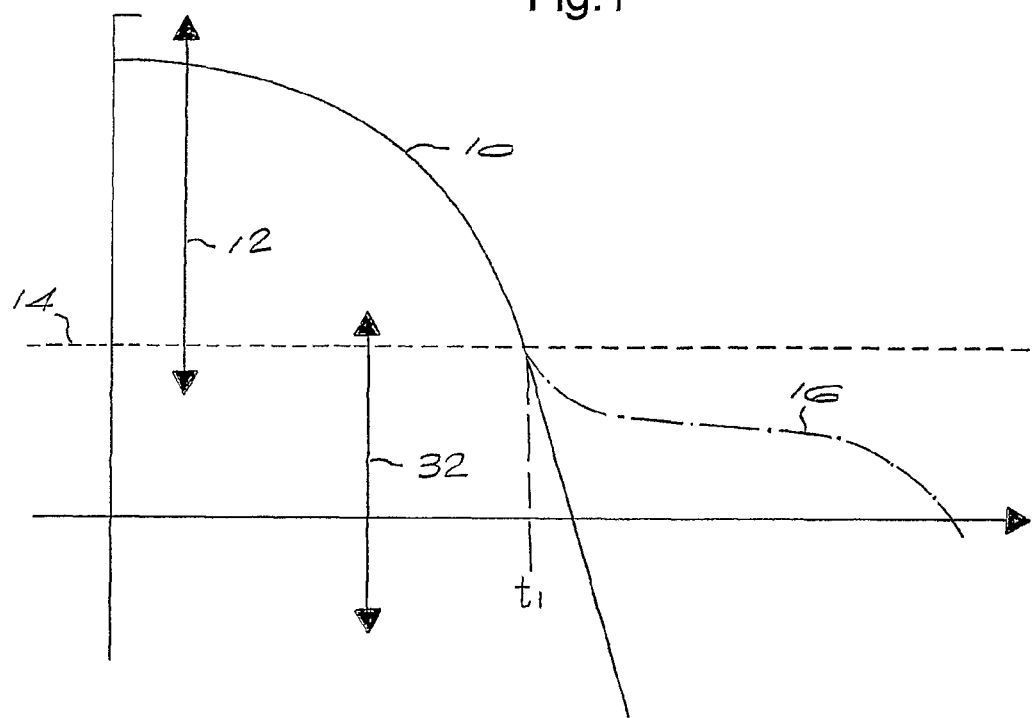
FIG. 1 shows a typical transient response of a secondary electromagnetic field produced by deep ore bodies that have been excited by the transmission of a primary electromagnetic field into the ground.
Figure 2:
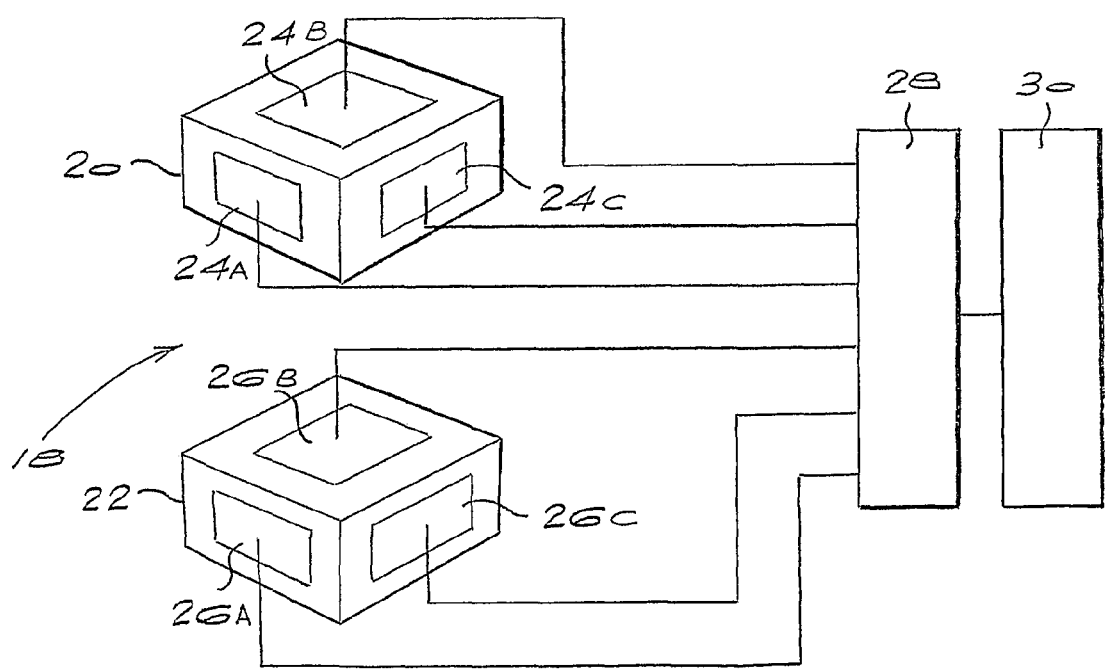
FIG. 2 shows a schematic diagram of an electromagnetic prospecting system according to the present invention that allows recording of the secondary electromagnetic field both before time $t_1$ shown in FIG. 1 and after time $t_1$.

Preferably, the sensitivity of the second sensor is around 50 $fT/\sqrt{Hz}$, and the sensitivity of the first sensor is around 5 $fT/\sqrt{Hz}$, resulting in the second sensor having a 10 times higher slew rate. Thus, the first sensor 20 is designed to measure the late times of the time domain electromagnetic decay shown in FIG. 1 with high precision, whereas the second sensor is designed to measure the early times of the decay. This enables the system to accurately measure the decay curve over the entire time span of the signal.

Both first and second sensors 20, 22 are low temperature superconducting quantum interference device (SQUID) magnetometers. The sensors will thus typically be encased within a liquid Helium-filled cryostat, although this is not shown in the diagrams in order to clarify the description of the invention. Significantly, the cryostat is specifically designed to have a minimum of metal parts that could interfere with TEM measurements, yet that has efficient temperature control characteristics to allow 24 hour helium refilling intervals.

The first and second sensors 12, 14 are connected via control, auto-tuning and amplifying electronics 28, to a data collector 30, for collecting and recording field data over the entire decay curve of the secondary electromagnetic field. The six inputs into the data collector 30 thus define a six-channel magnetometer SQUID system having characteristics suitable for high sensitivity TEM measurements.

The high- and low-sensitivity sensors can be switched on to operate separately as well as simultaneously via switches on the control electronics 28. Preferably, the control electronics 28 incorporates a circuit to determine the slew rate of the magnetic field by the data acquired by the second magnetometer 22 and controls the operation mode of the first sensor 20. By this means, the first magnetometer 20 is only operated if the slew rate is small enough to allow its stable operation.

Thus, referring back to FIG. 1, the receiver of the present invention will not only be able to pick up the secondary field in the range indicated by arrow 12, but also in the range indicated by arrow 32.

The invention claimed is:

1. An electromagnetic prospecting system comprising:
a transmitter for transmitting a primary electromagnetic field so as to generate a secondary electromagnetic field from a terrain that is being prospected, the secondary electromagnetic field having a transient, decaying time domain profile; and
a receiver system comprising first and second sensors for detecting the secondary electromagnetic field, wherein the second sensor is less sensitive than the first sensor so as to detect the secondary electromagnetic field over a first time period, with the first sensor being used to detect the secondary electromagnetic field after the first time period.

2. An electromagnetic prospecting system according to claim 1, which further includes a data collector that is connected to the first and second sensors, for collecting and recording field data over the entire decay curve of the secondary electromagnetic field.

3. An electromagnetic prospecting system according to claim 2, wherein the data collector collects and records field data over the entire decay curve of the secondary electromagnetic field to a lower sensitivity level of 5 $fT/\sqrt{Hz}$ for subsequent processing.

4. An electromagnetic prospecting system according to claim 1, wherein the second sensor is approximately 10 times less sensitive than the first sensor.

5. An electromagnetic prospecting system according to claim 1, wherein each of said first and second sensors comprises three orthogonal magnetometers.

6. An electromagnetic prospecting system according to claim 5, wherein the magnetometers of the first and second sensors are low temperature superconducting quantum interference device (SQUID) magnetometers.

7. A receiver system for an electromagnetic prospecting system comprising a transmitter for transmitting a primary electromagnetic field so as to generate a secondary electromagnetic field from a terrain that is being prospected, the secondary electromagnetic field having a transient, decaying time domain profile, the receiver system comprising first and second sensors for detecting the secondary electromagnetic field, wherein the second sensor is less sensitive than the first sensor so as to detect the secondary electromagnetic field over a first time period, with the first sensor being used to detect the secondary electromagnetic field after the first time period.

8. A receiver system according to claim 7, which further includes a data collector that is connected to the first and second sensors, for collecting and recording field data over the entire decay curve of the secondary electromagnetic field.

9. A receiver system according to claim 8, wherein the data collector collects and records field data over the entire decay curve of the secondary electromagnetic field to a lower sensitivity level of 5 $fT/\sqrt{Hz}$ for subsequent processing.

10. A receiver system according to claim 7, wherein the second sensor is approximately 10 times less sensitive than the first sensor.

11. A receiver system according to claim 7, wherein each of said first and second sensors comprises three orthogonal magnetometers.

12. A receiver system according to claim 11, wherein the magnetometers of the first and second sensors are low temperature superconducting quantum interference device (SQUID) magnetometers.

13. A method of collecting data in an electromagnetic prospecting system comprising a transmitter for transmitting a primary electromagnetic field so as to generate a secondary electromagnetic field from a terrain that is being prospected, the secondary electromagnetic field having a transient, decaying time domain profile, the method comprising the steps of:

providing a receiver system comprising first and second sensors for detecting the secondary electromagnetic field, wherein the second sensor is less sensitive than the first sensor using the second sensor to detect the secondary electromagnetic field over a first time period; and using the first sensor to detect the secondary electromagnetic field after the first time period.

14. A method of collecting data in an electromagnetic prospecting system according to claim 13, which further includes collecting and recording field data detected by the first and second sensors over the entire decay curve of the secondary electromagnetic field.

15. A method of collecting data in an electromagnetic prospecting system according to claim 14, which includes collecting and recording field data over the entire decay curve of the secondary electromagnetic field to a lower sensitivity level of 5 fT/√Hz for subsequent processing.

* * * * *